US011213937B1

(12) United States Patent
Rajzer et al.

(10) Patent No.: US 11,213,937 B1
(45) Date of Patent: Jan. 4, 2022

(54) TOOL ILLUMINATION SOURCE

(71) Applicant: Snap-on Incorporated, Kenosha, WI (US)

(72) Inventors: Michael T. Rajzer, Kenosha, WI (US); Jason Genz, Kenosha, WI (US); Craig Brouwers, Kenosha, WI (US); Joshua M. Beer, Kenosha, WI (US)

(73) Assignee: Snap-on Incorporated, Kenosha, WI (US)

(*) Notice: Subject to any disclaimer, the term of this patent is extended or adjusted under 35 U.S.C. 154(b) by 0 days.

(21) Appl. No.: 17/028,296

(22) Filed: Sep. 22, 2020

(51) Int. Cl.

| | |
|---|---|
| ***H01L 21/60*** | (2006.01) |
| ***H01L 23/12*** | (2006.01) |
| ***B25B 23/18*** | (2006.01) |
| ***B25B 21/00*** | (2006.01) |
| ***F21V 5/04*** | (2006.01) |
| ***F21V 23/00*** | (2015.01) |
| ***F21V 33/00*** | (2006.01) |
| *F21Y 115/10* | (2016.01) |

(52) U.S. Cl.
CPC ............ *B25B 23/18* (2013.01); *B25B 21/004* (2013.01); *F21V 5/046* (2013.01); *F21V 23/005* (2013.01); *F21V 33/0084* (2013.01); *F21Y 2115/10* (2016.08)

(58) Field of Classification Search
CPC .... F21V 5/046; F21V 23/005; F21V 33/0084; B25B 23/18; B25B 21/004
See application file for complete search history.

(56) References Cited

U.S. PATENT DOCUMENTS

| | | | | |
|---|---|---|---|---|
| 6,095,659 | A | 8/2000 | Hsu | |
| 6,260,979 | B1 | 7/2001 | Lin | |
| 6,283,607 | B1 | 9/2001 | Lin | |
| 6,379,019 | B1 | 4/2002 | Lin | |
| 6,386,727 | B1 | 5/2002 | Yeh | |
| 6,454,429 | B1 | 9/2002 | Liao | |
| 6,474,837 | B1 * | 11/2002 | Belliveau | F21L 4/027 362/231 |
| 6,497,494 | B1 | 12/2002 | Lin | |
| 7,185,998 | B2 | 3/2007 | Oomori et al. | |
| 7,278,751 | B2 | 10/2007 | Chang et al. | |
| 7,307,230 | B2 | 12/2007 | Chen | |
| 7,705,482 | B2 | 4/2010 | Leininger | |
| 7,726,863 | B2 | 6/2010 | Brandstaetter et al. | |
| 7,815,356 | B2 | 10/2010 | Lutz et al. | |
| 7,874,694 | B2 | 1/2011 | Li | |
| 7,934,847 | B2 | 5/2011 | Oomori et al. | |
| 7,993,023 | B2 | 8/2011 | Wang | |
| 8,042,966 | B2 | 10/2011 | Lutz et al. | |
| 8,162,363 | B2 | 4/2012 | Wang | |
| 8,317,350 | B2 | 11/2012 | Friedman et al. | |
| 8,328,381 | B2 | 12/2012 | Dixon et al. | |
| 8,496,366 | B2 | 7/2013 | Leong | |

(Continued)

FOREIGN PATENT DOCUMENTS

| | | |
|---|---|---|
| JP | 2002154065 | 5/2002 |

*Primary Examiner* — Arman B Fallahkhair
(74) *Attorney, Agent, or Firm* — Seyfarth Shaw LLP

(57) ABSTRACT

An illumination source disposed in a housing of a tool without the need for fasteners or snaps. The illumination source includes a number illumination elements, such as LEDs, disposed on a circuit board. A lens and the housing cooperatively direct light emitted by the illumination elements away from a user's eyes during use of the tool.

16 Claims, 5 Drawing Sheets

(56) References Cited

U.S. PATENT DOCUMENTS

| | | | | |
|---|---|---|---|---|
| 8,506,108 | B2 | 8/2013 | Friedman et al. | |
| 8,519,558 | B2 | 8/2013 | Leininger | |
| 8,820,955 | B2 | 9/2014 | Dixon et al. | |
| 8,827,483 | B2 | 9/2014 | Dixon et al. | |
| 8,872,370 | B2 | 10/2014 | Leininger | |
| 9,028,088 | B2 | 5/2015 | Vanko et al. | |
| 9,203,281 | B2 | 12/2015 | Leininger | |
| 9,242,355 | B2 | 1/2016 | Sergyeyenko et al. | |
| 9,328,915 | B2 | 5/2016 | Vanko et al. | |
| 9,352,458 | B2 | 5/2016 | Friedman et al. | |
| 9,539,691 | B2 | 1/2017 | Hirschburger | |
| 9,644,837 | B2 | 5/2017 | Vanko et al. | |
| 10,040,181 | B2 | 8/2018 | Fu et al. | |
| 10,052,733 | B2 | 8/2018 | Ely et al. | |
| 10,173,307 | B2 | 1/2019 | Sergyeyenko et al. | |
| 10,174,934 | B2 | 1/2019 | Padget et al. | |
| 10,525,582 | B2 | 1/2020 | Qiu et al. | |
| 10,543,588 | B2 | 1/2020 | Vanko et al. | |
| 10,960,509 | B2 | 3/2021 | Ely et al. | |
| 2002/0097572 | A1* | 7/2002 | Yeh | F21L 4/00 362/119 |
| 2008/0266845 | A1* | 10/2008 | Wu | B25B 15/02 362/157 |
| 2008/0278930 | A1 | 11/2008 | Wu et al. | |
| 2011/0058356 | A1 | 3/2011 | Friedman et al. | |
| 2011/0199756 | A1 | 8/2011 | Oomori et al. | |
| 2015/0049467 | A1* | 2/2015 | Thompson | B25B 23/18 362/120 |
| 2016/0052112 | A1* | 2/2016 | Lemley, Jr. | B25B 23/18 362/119 |
| 2017/0106523 | A1 | 4/2017 | Pan | |
| 2019/0061124 | A1 | 2/2019 | Sergyeyenko et al. | |

* cited by examiner

TOOL ILLUMINATION SOURCE

TECHNICAL FIELD OF THE INVENTION

The present invention relates generally to an illumination source for a hand tool.

BACKGROUND OF THE INVENTION

Hand tools, such as, for example, motorized ratchet wrenches and drivers, are commonly used in automotive, industrial, and household applications to tighten and untighten work pieces, such as threaded fasteners, and apply a torque and/or angular displacement to a work piece, for example. These hand tools are often used in areas that are dimly lit and have restricted space, such as an engine bay, making it difficult to see and perform certain jobs.

Typically, hand tools include a single LED disposed adjacent to the drive lug of the tool. However, this single LED only illuminates only a small area adjacent to the drive lug, thus does not provide sufficient illumination to the dimly lit area surrounding the work piece. Other tools that include multiple LEDs surrounding a housing of the tool require additional structure and/or fasteners attached to the tool to mount the LEDs thereto. These additional structures and fasteners cause the tool to be bulky and more difficult to use in areas with restricted space.

SUMMARY OF THE INVENTION

The present invention relates broadly to an illumination source for a hand tool having a tool housing. The illumination source includes illumination elements, such as LEDs, disposed on a circuit board such as, a printed circuit board (PCB) or flexible printed circuit (FPC). The circuit board is shaped to substantially correspond with internal geometry of the tool housing. The illumination source is retained in the tool housing without use of fasteners and/or snaps. The tool housing also includes a circumferential rim adapted to retain a lens. The lens and the rim are cooperatively adapted to direct light emitting from the illumination elements away from a user's eyes and towards a work area of the tool to illuminate an area surrounding a work piece. Accordingly, the tool containing the illumination source is more compact and has improved illumination as compared to the current art.

In an embodiment, the present invention broadly comprises a tool that includes a housing portion having a circumferential rim, a driver portion coupled to the housing portion and having a base portion, an illumination source disposed in the housing portion between the circumferential rim and the base portion, the illumination source having illumination elements disposed on a circuit board and adapted to emit light, and a lens adapted to diffuse light emitted by the illumination elements. The lens is disposed between the illumination source and the circumferential rim.

In another embodiment, the present invention broadly comprises an illumination source for a tool having housing and driver portions and a lens. The illumination source comprises a circuit board having a shape that substantially corresponds to an internal geometry of the housing portions and is adapted to be disposed in the housing portion, and illumination elements disposed on the circuit board and adapted to emit light towards the lens.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its construction and operation, and many of its advantages should be readily understood and appreciated.

DETAILED DESCRIPTION OF THE INVENTION

Figure 1:
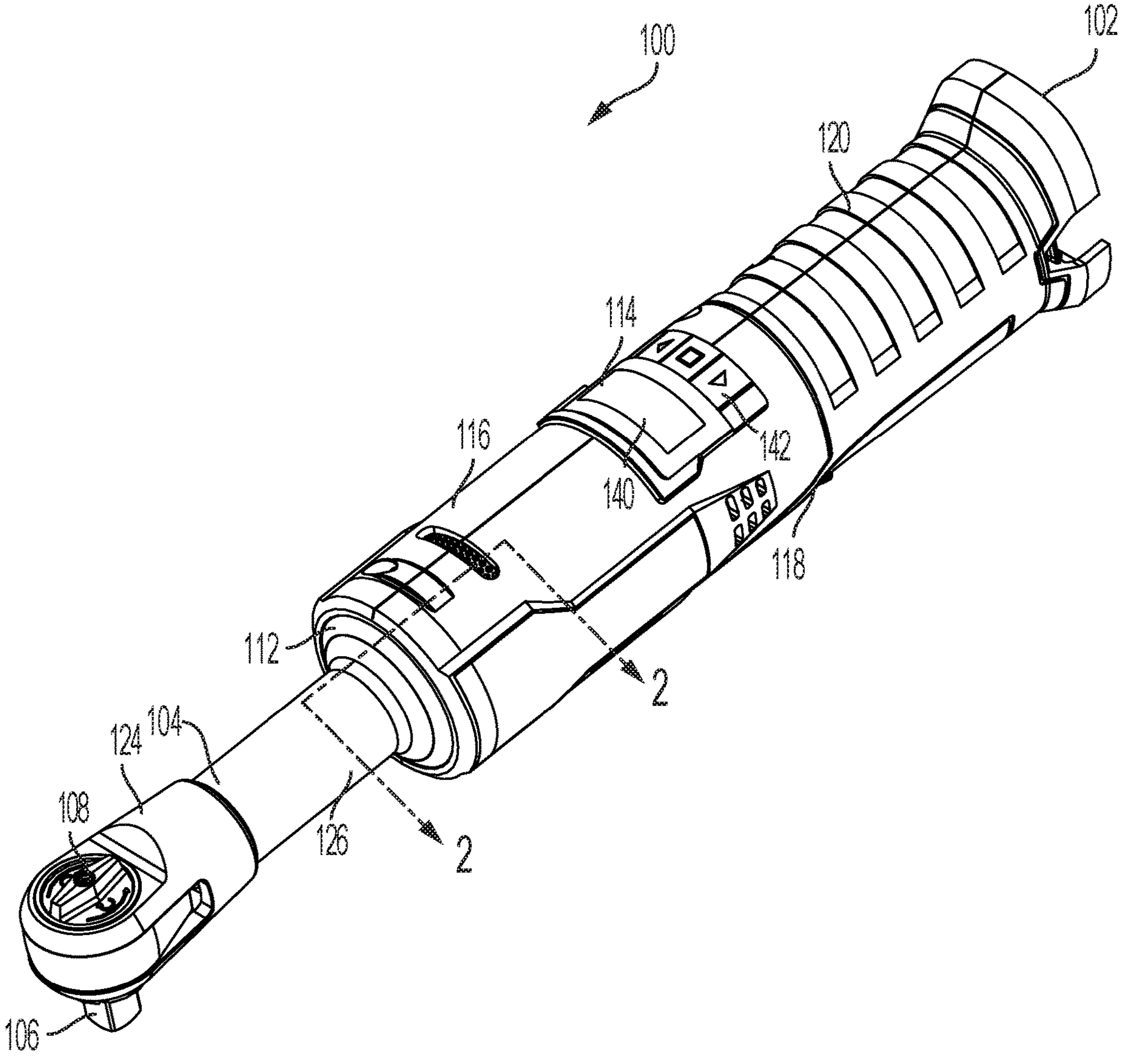
FIG. 1 is a perspective view of an exemplar tool, such as a motorized ratchet tool, including an illumination source in accordance with an embodiment of the present invention.
Figure 2:
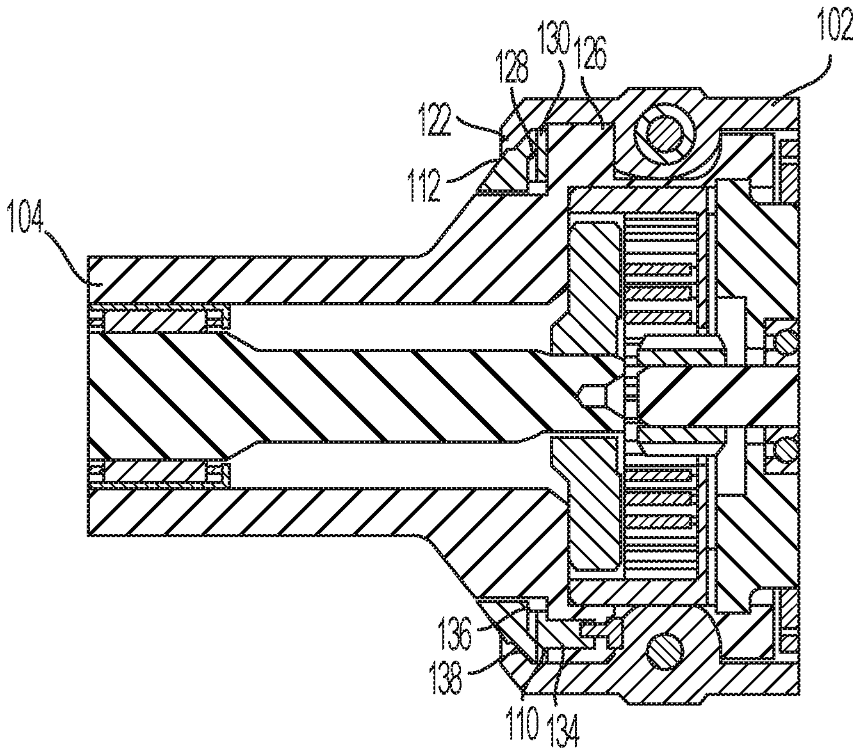
FIG. 2 is a section view of the tool of FIG. 1 taken along line 2-2 of FIG. 1.

While the present invention is susceptible of embodiments in many different forms, there is shown in the drawings, and will herein be described in detail, embodiments of the invention, including a preferred embodiment, with the understanding that the present disclosure is to be considered as an exemplification of the principles of the present invention and is not intended to limit the broad aspect of the invention to any one or more embodiments illustrated herein. As used herein, the term "present invention" is not intended to limit the scope of the claimed invention, but is instead used to discuss exemplary embodiments of the invention for explanatory purposes only.

The present invention broadly comprises an illumination source disposed in a motorized hand tool having a housing, such as, for example, a motorized ratchet tool. The illumination source includes one or more illumination elements, for example LEDs, disposed on a circuit board, such as, for example, a printed circuit board (PCB) or flexible printed circuit (FPC). The circuit board can be shaped to substantially correspond to an internal geometry of the housing. In an embodiment, the illumination source is held in place by a circumferential rim of the housing, a lens, and a driver portion, such that fasteners and/or snaps are not needed for installation. The rim of the housing and lens cooperatively directs light emitted from the illumination elements away from a user's eyes to restrict glare into the user's eyes and illuminate an area surrounding a drive lug of the tool during use of the tool.

Referring to FIGS. 1-5, a hand operated tool 100, such as, for example, a motorized ratchet tool, includes a housing portion 102 adapted to be held by a user and a driver portion 104 coupled to the housing portion 102. The driver portion 104 is adapted to apply torque to a work piece and includes a drive lug 106 adapted to engage tool pieces (e.g., socket or bit) to then engage and drive the work piece, for example, in a well-known manner. The drive lug 106 is operatively coupled to and driven by a motor via a ratcheting mechanism of the driver portion 104 in a well-known manner. The driver portion 104 also includes a selector knob 108 adapted to select a rotational drive direction of the drive lug 106. The driver portion 104 may be a ratchet head of a ratchet tool.

The housing portion 102 encloses one or more of the motor adapted to drive the drive lug 106, a trigger (not shown) adapted to actuate the motor, a power source adapted to provide electrical power for the motor, such as, for example, a battery, an illumination source 110, a lens 112, and a display assembly 114. The housing portion 102 is assembled from two or more mateable clamshell housing portions 116, 118 coupled together to cooperatively form the housing portion 102. The housing portion 102 includes a handle portion 120 that a user may grip or hold during operation of the tool 100. The housing portion 102 may be constructed of a plastic material.

The first clamshell housing portion 116 and second clamshell housing portion 118 are configured to couple together and subsequently house the driver assembly 104, thereby enclosing one or more of the motor, the power source, the illumination source 110, the lens 112, and the display assembly 114. When assembled, as shown in FIG. 1, for example, the clamshell housing portions 116, 118, retain the illumination source 110 and lens 112 therein without the need for additional fasteners and/or snaps. Each of the clamshell housing portions 116, 118 includes a circumferential rim 122 adapted to restrict axial movement of the illumination source 110 and lens 112 relative to the clamshell housing portions 116, 118. The circumferential rim 122 also directs light emitted from the illumination source 110 away from a user's eyes during normal operation of the tool 100.

In an embodiment, the driver portion 104 includes a head portion 124 and a base portion 126 that at least partially circumferentially surrounds the head portion 124 and corresponds to internal geometry of the housing portion 102 to be coupled thereto. The head portion 124 houses one or more of the drive lug 106, the selector knob 108, and the ratcheting mechanism.

The illumination source 110 and the lens 112 are disposed in the housing portion 102 between the circumferential rim 122 and the base portion 126, thereby restricting movement of the illumination source 110 and the lens 112 in the axial direction relative to the housing portion 102. For example, as illustrated, the illumination source 110 abuts the base portion 126, and the lens 112 abuts the circumferential rim 122, such that the illumination source 110 and the lens 112 are "sandwiched" between the circumferential rim 122 and the base portion 126. In an embodiment, the lens 112 can be rotated relative to the housing portion 102 and the illumination source 110.

The illumination source 110 includes one or more illumination elements 128 disposed on a circuit board 130, such as, for example, a printed circuit board (PCB) or flexible printed circuit (FPC). The illumination elements 128 can be light emitting diodes (LEDs), incandescent, halogen, fluorescent, or high intensity discharge (HID) bulbs, or the like, operationally coupled to the power source via the circuit board 130 and an operation switch (not shown). The switch can be adapted to selectively turn the illumination elements 128 ON or OFF.

Figure 3:
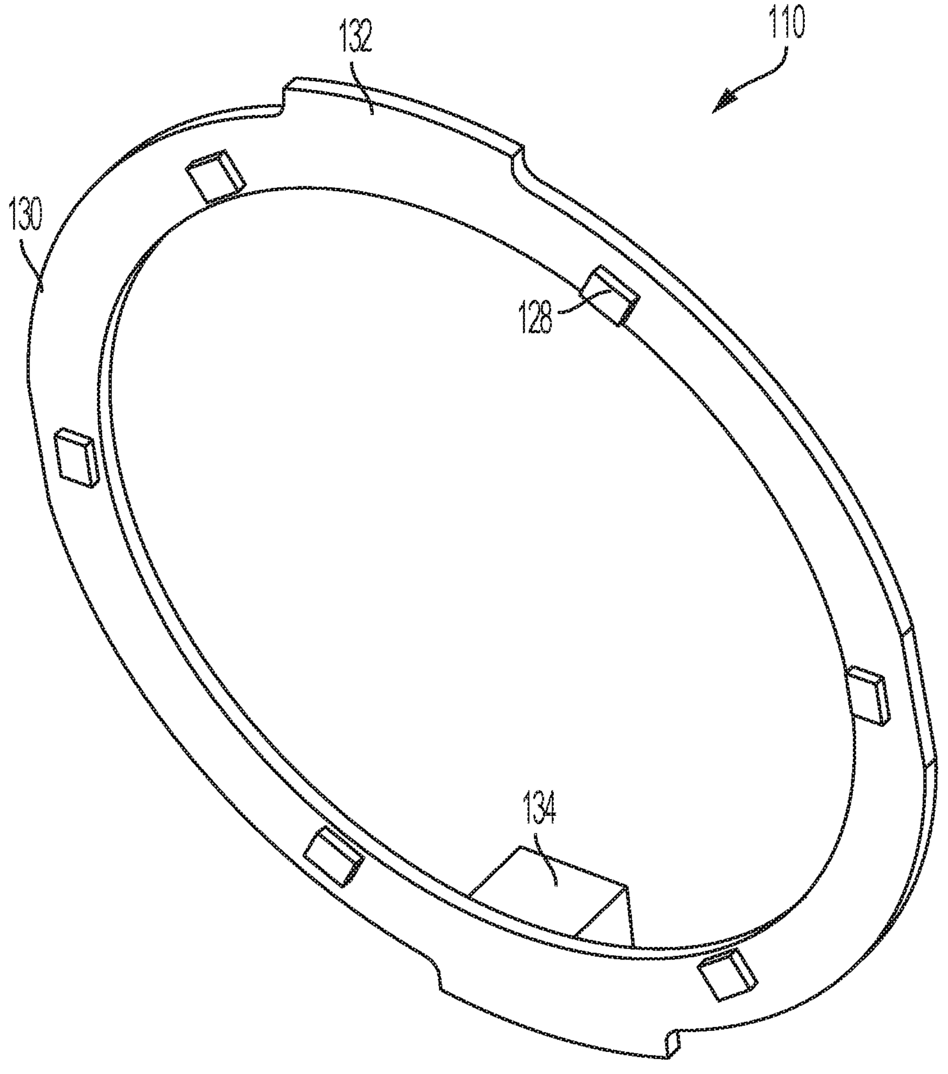
FIG. 3 is a perspective view of an illumination source in accordance with an embodiment of the present invention.
Figure 4:
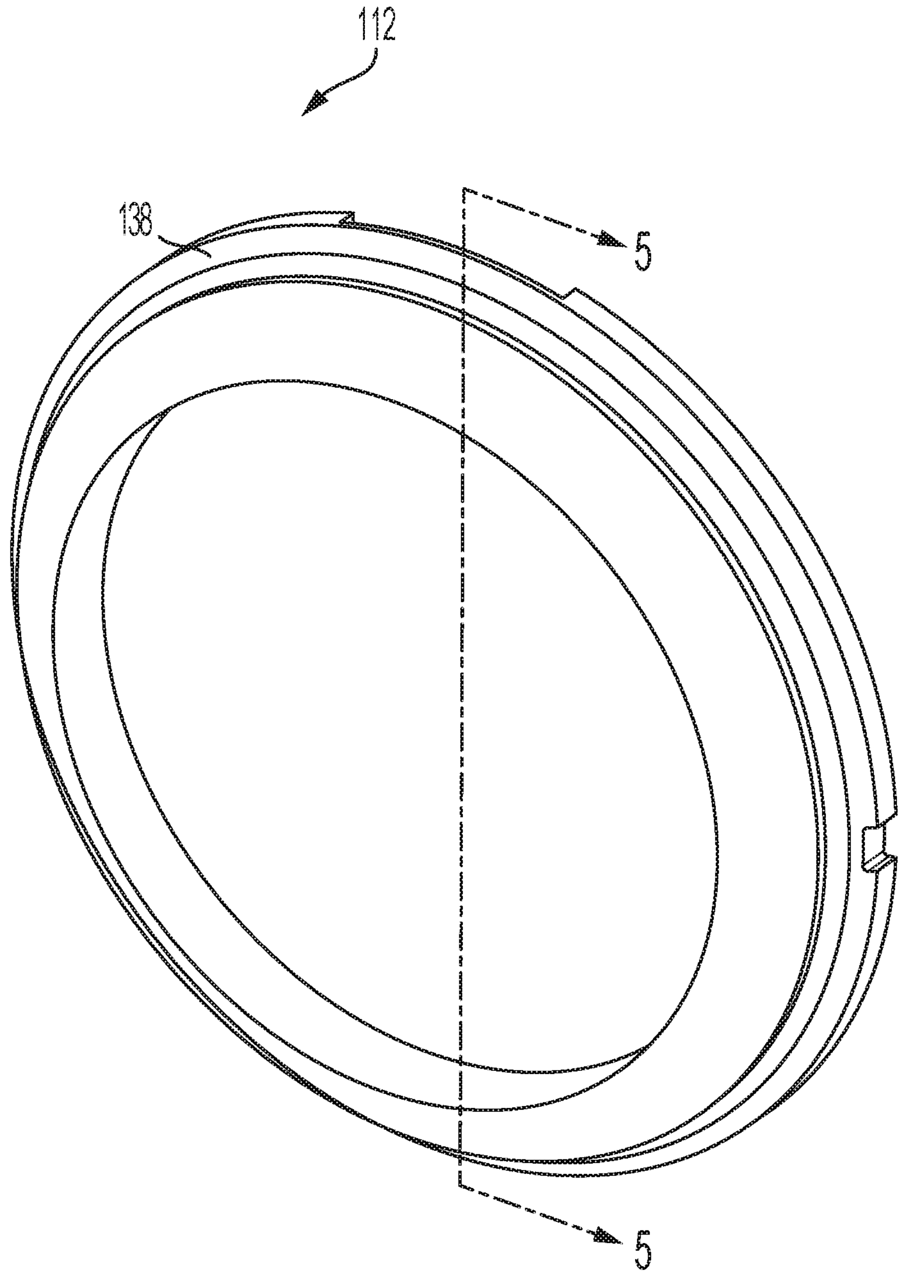
FIG. 4 is a perspective view of a lens, in accordance with an embodiment of the present invention.
Figure 5:
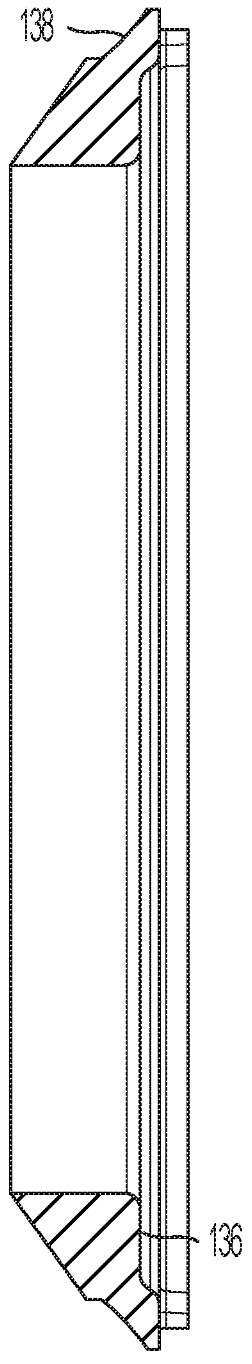
FIG. 5 is a section view of the lens of FIG. 4 taken along line 5-5 of FIG. 4.

Although shown in FIG. 3 as having six equidistantly spaced illumination elements 128, the illumination source 110 can have any suitable number of illumination elements, and can be spaced in any suitable fashion. The switch may be a manually operated switch or may be actuated in response to the user operating the trigger. The switch may include an actuation mechanism that employs a push button type actuator or other type of actuator to activate or operate the switch, such as, for example, a toggle actuator, a touch sensitive actuator, rocker actuator, a slide actuator, magnetic, or other suitable actuator or device. The switch may be coupled anywhere on the tool 100, such as on or adjacent to the handle portion 120 to allow a user to easily actuate the switch while operating the tool 100. The switch can also be disposed inside the housing portion 102 and adapted to be actuated by the trigger such that the illumination elements 128 are in the ON state when the user operates the tool 100.

The circuit board 130 can have a cross-sectional shape that substantially matingly corresponds to the internal geometry of the housing portion 102. For example, the circuit board 130 has a substantially circular shape and includes one or more protrusions 132 that are adapted to engage corresponding recesses in the housing portion 102 to restrict rotational movement of the circuit board 130 relative to the tool 100. The circuit board 130 also includes a wire connector 134 adapted to electrically connect the circuit board 130 to the switch and power source via electrical wiring.

The lens 112 has a cross-section that substantially corresponds to internal geometry of the housing portion 102 and the external geometry of the driver portion 104. For example, the lens 112 has a substantially circular shape. The lens 112 is adapted to protect the illumination source 110 from dust and other debris and diffuse light emitted from the illumination elements 128. The lens 112 includes a recess 138 adapted to engage the circumferential rim 122. Accordingly, the lens 112 and the circumferential rim 122 cooperatively direct light emitted from the illumination elements 128 away from a user's eyes and in a direction towards an area surrounding the drive lug 106, thereby illuminating the work area. In an embodiment, the lens 112 can be constructed from a light diffusing material to uniformly distribute light emitted from the illumination elements 128. In one example, the lens 112 is essentially a solid piece of material with a substantially circular cross-section. The lens 112 can be made of a non-colored, clear (i.e. transparent) plastic material, such as, for example, acrylic. However, the invention is not limited as such and the material of the lens 112 need not be clear or transparent. Instead, the material can be translucent to some degree. In other examples, the material is a light specific material, i.e., a higher-grade plastic or other material, designed with particular light refracting and propagating characteristics.

In another example, the lens 112 includes patterns of different, predetermined surface features on an internal facing surface 136 facing the illumination source 110. The surface features are configured to transmit, reflect, block, refract, or redirect light in different ways to produce desired light diffusion effects. The surface features could be molded into the surfaces or could be formed into the surfaces by blasting, cutting, mechanical etching, laser etching, engraving, or the like. Adjustment of the light diffusion effects of the illumination elements 128 can be performed by rotation of the lens 112 relative to the illumination source 110.

The display assembly 114 includes a display 140 adapted to indicate tool information to the user. In an embodiment, the display 140 is an LCD. The tool information can include, for example, a tool status, such as, for example, a power level of the power source, a selected driving direction of the drive lug 106, a power state of the motor, output torque of the tool 100, etc. The display assembly 114 further includes one or more buttons 142 adapted to receive a user input, such as, for example, selecting what is to be shown on the display 140, for selecting tool parameters, such as, for example, the driving direction of the drive lug 106, causing the switch to put the illumination elements 128 in an ON state, and/or for otherwise manipulating the display 140 to control the tool 100 and/or parameters of the tool 100.

As discussed above, the aspects of the present invention are described in terms of a motorized ratchet tool, as shown. However, it should be understood that aspects of the present invention could be implanted in other hand tools or implements. For example, and without limitation, the hand tool can be ratchet wrench, open wrench, screw driver, nut driver, or any other tool capable of applying torque to a work piece.

As used herein, the term "coupled" can mean any physical, electrical, magnetic, or other connection, either direct or indirect, between two parties. The term "coupled" is not limited to a fixed direct coupling between two entities.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of the inventors' contribution. The actual scope of the protection sought is intended to be defined in the following claims when viewed in their proper perspective based on the prior art.

What is claimed is:

1. A tool adapted to apply torque to a work piece, the tool comprising:

a housing portion having a circumferential rim;

a driver portion coupled to the housing portion and having a base portion;

an illumination source disposed in the housing portion between the circumferential rim and the base portion, the illumination source having illumination elements disposed on a circuit board shaped to substantially correspond with internal geometry of the housing; and a lens retained by the circumferential rim between the illumination source and the circumferential rim and adapted to diffuse light emitted by the illumination elements, wherein the lens and the circumferential rim are cooperatively adapted to direct light emitting from the illumination elements towards a work area.

2. The tool of claim 1, wherein the tool is a motorized ratchet tool.

3. The tool of claim 2, wherein the circumferential rim and the lens are adapted to direct light emitted by the illumination elements in a direction towards a drive lug of the tool.

4. The tool of claim 1, wherein the lens is rotatable relative to the illumination source.

5. The tool of claim 4, wherein the lens includes different surface features on an internal facing surface facing the illumination source, the different surface features adapted to produce different light diffusion effects, and wherein the light diffusion effects are selected by rotation of the lens.

6. The tool of claim 1, herein the housing assembly includes a clamshell housing having a first clamshell housing portion coupled to a second clamshell housing portion.

7. The tool of claim 1, wherein the circuit board is a printed circuit board that has a cross-section that substantially corresponds to internal geometry of the housing portion.

8. The tool of claim 1, wherein the illumination elements are LEDs.

9. The tool of claim 1, wherein the lens includes a recess adapted to engage the circumferential rim.

10. The tool of claim 1, wherein the circuit board is a flexible printed circuit.

11. An illumination source for a tool adapted to apply torque to a work piece, the tool having a housing with an internal geometry, a driver portion and a lens retained by a circumferential rim of the housing between the illumination source and the circumferential rim, the illumination source comprising:

a circuit board having a shape that substantially corresponds to the internal geometry of the housing portion and that is adapted to be disposed in the housing portion between the circumferential rim and a base portion of the driver portion, wherein the circuit board includes radially extending protrusions adapted to engage with the housing to restrict rotational movement of the circuit board relative to the housing; and illumination elements disposed on the circuit board, wherein the lens and the rim are cooperatively configured to direct light emitting from the illumination elements towards a work area.

12. The illumination source of claim 11, wherein light emitted by the illumination source is adapted to be diffused by the lens.

13. The illumination source of claim 11, wherein the circuit board is a printed circuit board (PCB) and has a substantially circular shape.

14. The illumination source of claim 11, wherein the circuit board is adapted to be disposed between the lens and a base of the driver portion.

15. The illumination source of claim 11, wherein light emitted by the illumination source is adapted to be directed by the lens and a circumferential rim of the housing portion.

16. The illumination source of claim 11, wherein the circuit board is a flexible printed circuit.

* * * * *